(12) United States Patent
Sung et al.

(10) Patent No.: US 12,354,942 B2
(45) Date of Patent: Jul. 8, 2025

(54) 3D PACKAGE CONFIGURATION

(71) Applicant: CCS Technology Corporation, Taoyuan (TW)

(72) Inventors: Tung-Po Sung, Taoyuan (TW); Chang-Cheng Lo, Taoyuan (TW)

(73) Assignee: CCS Technology Corporation, Taoyuan (TW)

( * ) Notice: Subject to any disclaimer, the term of this patent is extended or adjusted under 35 U.S.C. 154(b) by 808 days.

(21) Appl. No.: 17/678,197

(22) Filed: Feb. 23, 2022

(65) Prior Publication Data

US 2022/0199498 A1 Jun. 23, 2022

Related U.S. Application Data

(63) Continuation-in-part of application No. 17/158,080, filed on Jan. 26, 2021, now Pat. No. 11,373,983.

(30) Foreign Application Priority Data

Dec. 23, 2020 (TW) .................................. 109145694

(51) Int. Cl.
| | |
|---|---|
| *H01L 23/498* | (2006.01) |
| *H01L 23/00* | (2006.01) |
| *H01L 23/538* | (2006.01) |
| *H01L 25/065* | (2023.01) |
| *H05K 1/02* | (2006.01) |
| *H05K 1/18* | (2006.01) |

(52) U.S. Cl.
CPC ...... *H01L 23/4985* (2013.01); *H01L 23/5386* (2013.01); *H01L 24/16* (2013.01); *H01L 25/0655* (2013.01); *H01L 25/0657* (2013.01); *H05K 1/028* (2013.01); *H05K 1/189* (2013.01); *H01L 2924/15311* (2013.01)

(58) Field of Classification Search
None
See application file for complete search history.

(56) References Cited

U.S. PATENT DOCUMENTS

| | | | | |
|---|---|---|---|---|
| 5,448,511 | A * | 9/1995 | Paurus | H01L 25/0657 361/749 |
| 5,776,797 | A * | 7/1998 | Nicewarner, Jr. | H01L 25/0657 438/109 |
| 6,699,730 | B2 * | 3/2004 | Kim | H01L 25/0657 438/109 |
| 7,875,974 | B2 * | 1/2011 | Gokan | H01L 25/0657 257/730 |
| 11,218,583 | B2 * | 1/2022 | Lee | H01Q 1/2283 |
| 11,749,612 | B2 * | 9/2023 | Yu | H01L 25/18 257/668 |
| 2001/0006252 | A1 * | 7/2001 | Kim | H01L 25/0657 257/688 |
| 2006/0286717 | A1 * | 12/2006 | Solberg | H01L 23/5387 257/E25.023 |

* cited by examiner

*Primary Examiner* — Long Pham

(57) ABSTRACT

A novel 3D package configuration is provided by stacking a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies of various functions be bonded on one die and/or two side of a flexible circuit board and electrically connected therewith in advance.

10 Claims, 2 Drawing Sheets

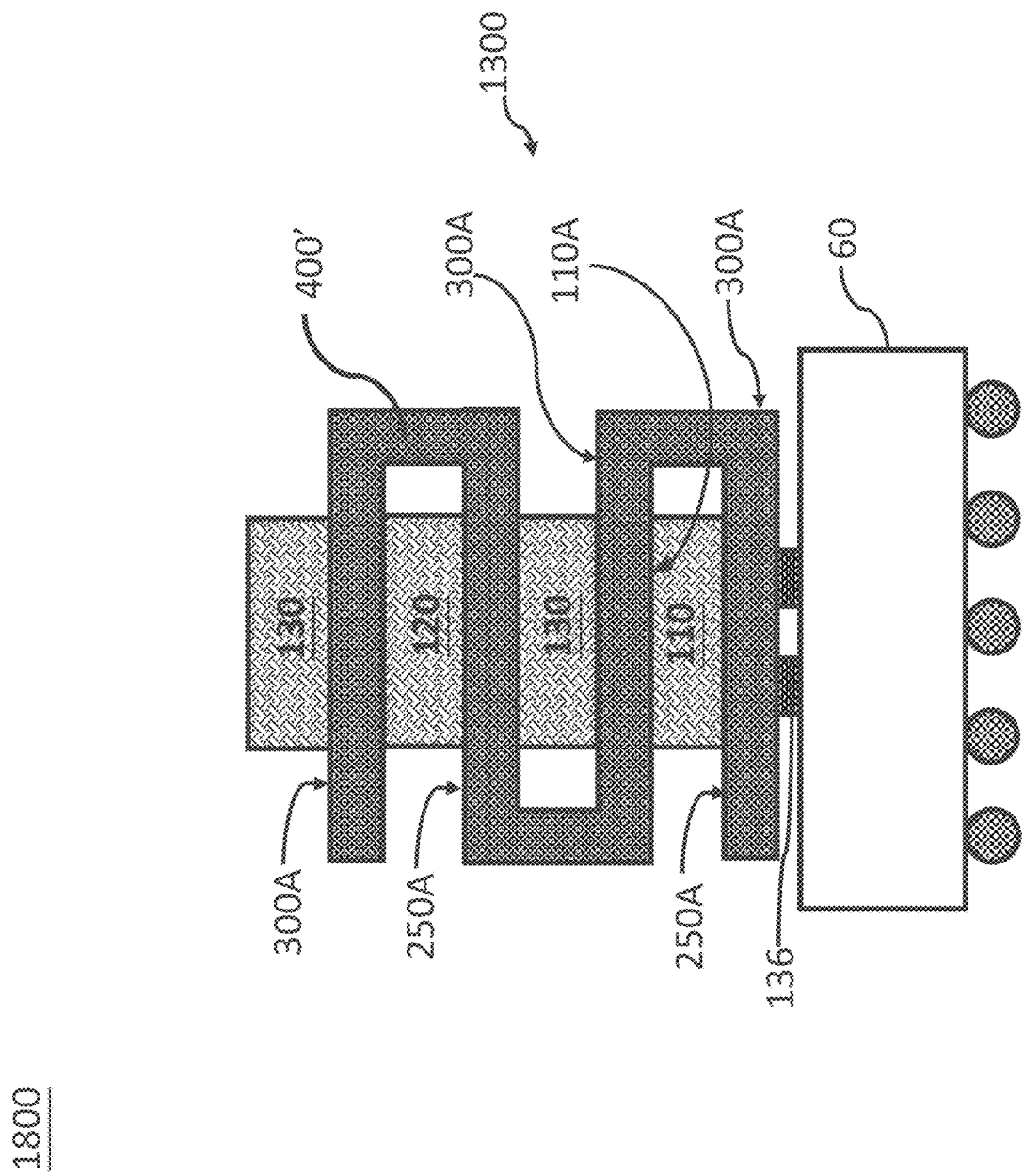

3D PACKAGE CONFIGURATION

CROSS-REFERENCE TO RELATED APPLICATION

This application is a continuation-in-part (CIP) application of, claims priority to and the benefit of, U.S. patent application Ser. No. 17/158,080 filed on Jan. 26, 2021 and entitled "3D PACKAGE CONFIGURATION", which claims the priority benefit of Taiwanese Application Serial Number 109145694, filed on Dec. 23, 2020, which is incorporated herein by reference.

TECHNICAL FILED

This invention relates to a package configuration, and particularly relates to a 3D package configuration.

BACKGROUND OF THE INVENTION

The application of 3D package configurations is rapidly developing to solve important technical issues such as miniaturization, multi-function integration, faster interconnection, and energy saving. A typical 3D package configuration usually obtained by stacking dies with through-silicon vias (TSV) or dies interconnected by micro-bumps and electrically connected to each other by micro-bumps.

However, the above-mentioned 3D package configurations usually involve thin film deposition, photolithography, development, etching, metallization and other semiconductor manufacturing processes, which are not only complicated in process and time-wasting in packaging, but also low yield rate and high cost. In view of these disadvantages, a novel 3D package configuration that can be manufactured by conventional techniques is highly expected by the industry.

SUMMARY OF THE INVENTION

This invention discloses a 3D package configuration, comprising: a package substrate; and a folded flexible circuit board structure vertically stacked on the package substrate and electrically connected therewith, comprising: a folded flexible circuit board formed by folding a strip-shaped flexible circuit board including a strip-shaped first flexible circuit board joined with a strip-shaped second flexible circuit board, wherein the strip-shaped first flexible circuit board comprises a first surface with a first die bonding zone and at least one second die bonding zone formed thereon and a second surface opposite to each other, and the strip-shaped second flexible circuit board comprises a third surface with at least one third die bonding zone formed thereon and a fourth surface opposite to each other, and a plurality of package substrate bonding pads under the first die bonding zone are formed on the third surface of the second flexible circuit board, and each of the package substrate bonding pads is electrically connected to each of the first die bonding pads corresponding thereof through a conductive hole; at least one first semiconductor die bonded to the first die bonding zone and electrically connected to the first flexible circuit board; at least one second semiconductor die bonded to the at least one second die bonding zone and electrically connected to the first flexible circuit board; and at least one third semiconductor die bonded to the at least one third die bonding zone and electrically connected to the second flexible circuit board; wherein, the at least one third semiconductor die and the at least one second semiconductor die are alternatively vertically stacked above the at least one first semiconductor die, and the folded flexible circuit board structure is electrically connected with the package substrate through the package substrate bonding pads.

The above-mentioned 3D package configuration comprises a plurality of second semiconductor dies spaced with each other, and a plurality of second die bonding zones formed on the strip-shaped first surface of the first flexible circuit board, wherein each of the second semiconductor dies is bonded to each of the second die bonding zone and electrically connected to the strip-shaped first flexible circuit board through a second bonding pad in each of the second die bonding zone.

The above-mentioned 3D package configuration comprises a plurality of third semiconductor dies spaced with each other, and a plurality of third die bonding zones formed on the third surface of the strip-shaped second flexible circuit board, wherein each of the third semiconductor dies is bonded to one of the third die bonding zones and electrically connected to the strip-shaped second flexible circuit board through a third bonding pad in each of the third bonding zones.

The above-mentioned 3D package configuration, wherein the strip-shaped first flexible circuit board comprises a plurality of first bonding pads and a plurality of second bonding pads respectively formed on the second surface corresponding to the first die bonding zone and the at least one second die bonding zone, and the strip-shaped second flexible circuit board comprises a plurality of third bonding pads formed on the fourth surface corresponding to the at least one third die bonding zone, and the strip-shaped first flexible circuit is joined with the strip-shaped second flexible circuit board by the first bonding pads and the second pads formed on the second surface of the strip-shaped first flexible circuit and the third bonding pads formed on the fourth surface of the strip-shaped second flexible circuit board.

The above-mentioned 3D package configuration, wherein the strip-shaped first flexible circuit board comprises: a strip-shaped first flexible insulating substrate; a first circuit formed on a surface of the strip-shaped first flexible insulating substrate; and a strip-shaped first insulating layer overlaying the first circuit; wherein, the first die bonding zone comprises a plurality of first bonding pads electrically connected to the first circuit to make the at least one first semiconductor die electrically connected to the first circuit through the first bonding pads, and the at least one second die bonding zone comprises a plurality of second die bonding pads electrically connected to the first circuit to make the at least one second semiconductor die electrically connected to the first circuit through the second die bonding pads.

The above-mentioned 3D package configuration, wherein the material of the strip-shaped first flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned 3D package configuration, wherein the material of the first circuit is selected from one of the group consisting of copper, copper alloy, tinned copper, tin alloy, aluminum, aluminum alloys, gold and silver, or combinations thereof.

The above-mentioned 3D package configuration, wherein the strip-shaped second flexible circuit board comprises: a strip-shaped second flexible insulating substrate; a second circuit formed on a surface of the strip-shaped second flexible insulating substrate; and a strip-shaped second insulating layer overlaying the second circuit; wherein, the at least one third die bonding zone is arranged to interlace with the first die bonding zone and the least one second die bonding zone, and the at least one third die bonding zone comprises a plurality of third bonding pads electrically connected to the second circuit to make the at least one third semiconductor die electrically connected to the second circuit through the third bonding pads.

The above-mentioned 3D package configuration, wherein the material of the strip-shaped second flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The above-mentioned 3D package configuration, wherein the material of the second circuit is selected from one of the group consisting of copper, copper alloy, tinned copper, tin alloy, aluminum, aluminum alloys, gold and silver, or combinations thereof.

BRIEF DESCRIPTION OF THE DRAWINGS

FIGS. 1A~1B are cross-sectional views showing processes for manufacturing a 3D package configuration 1800 according to Embodiment of this present invention.

DETAILED DESCRIPTION OF THE INVENTION

Figure 1A:
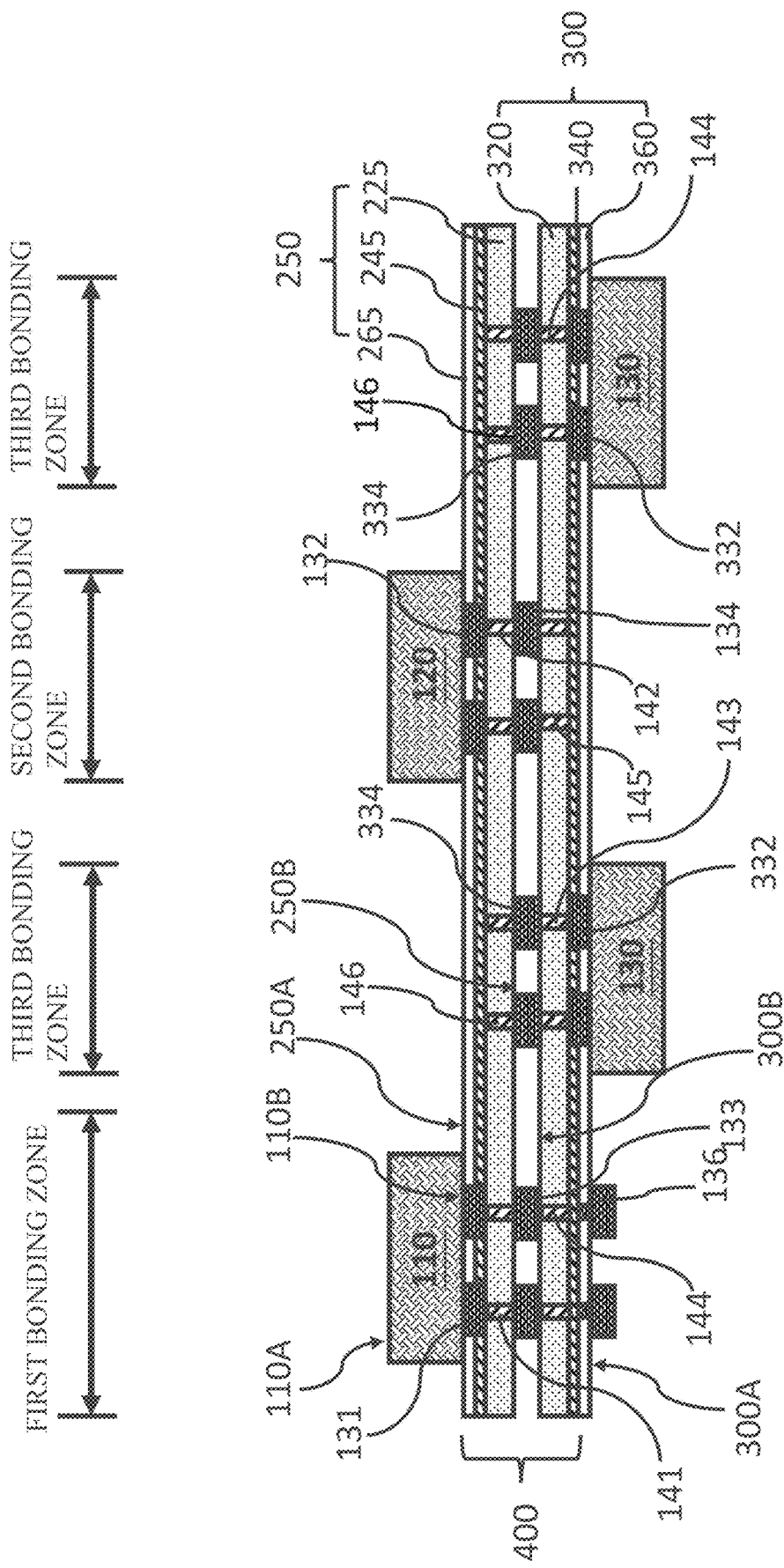

In the following detailed description, for purposes of explanation, numerous specific details are set forth in order to provide a thorough understanding of the disclosed Embodiment. It will be apparent, however, that one or more Embodiments may be practiced without these specific details.

It is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

EMBODIMENT

Please refer to FIGS. 1A~1B. FIGS. 1A~1B are cross-sectional views showing processes for manufacturing a 3D package configuration 1800 according to Embodiment of this present invention.

This present Embodiment discloses a 3D package configuration 1800 as shown in FIG. 1B, comprising a package substrate 60 and a folded flexible circuit board structure 1300 vertically stacked on the package substrate 60 and electrically connected therewith. The folded flexible circuit board structure 1300 comprises a folded flexible circuit board 400' formed by folding a strip-shaped flexible circuit board 400 as shown in FIG. 1A including a strip-shaped first flexible circuit board 250 joined with a strip-shaped second flexible circuit board 300, a first semiconductor die 110 and at least one second semiconductor die 120 bonded to the first flexible circuit board 250, and at least one third semiconductor die 130 bonded to the second flexible circuit board 300. As shown in FIG. 1A, the strip-shaped first flexible circuit board 250 comprises a strip-shaped first insulating substrate 225, a first circuit 245 formed on a surface of the strip-shaped first flexible insulating substrate 225 and a strip-shaped first insulating layer 265 overlaying the first circuit 245, wherein the strip-shaped first flexible circuit board 250 has a first surface 250A with a first die bonding zone and a second die bonding zone formed thereon and a second surface 250B opposite to the first surface 250A, and the first die bonding zone has a plurality of first die bonding pads 131 electrically connected to the first circuit 245, and the second die bonding zone has a plurality of second die bonding pads 132 electrically connected to the first circuit 245, and the second surface 250B corresponding to the first die bonding zone and the second die bonding zone further comprises a plurality of first bonding pads 133 electrically connected to the first circuit 245 through first conductive holes 141 and second bonding pads 134 electrically connected to the first circuit 245 through second conductive holes 142. The first semiconductor die 110 is bonded to the first die bonding zone and electrically connected to the first circuit 245 through the first die bonding pads 131. The at least one second semiconductor die 120 is bonded to the second die bonding zone and electrically connected to the first circuit 245 through the second die bonding pads 132. As shown in FIG. 1A, the strip-shaped second flexible circuit board 300 comprises a strip-shaped second insulating substrate 320, a second circuit 340 formed on a surface of the strip-shaped second flexible insulating substrate 320 and a strip-shaped second insulating layer 360 overlaying the second circuit 340, wherein the second flexible circuit board 300 has a third surface 300A with at least one third die bonding zone and a fourth surface 300B opposite to the third surface 300A, and the third die bonding zone has a plurality of third die bonding pads 334 electrically connected to the second circuit 340 through the third conductive holes 143 formed in the second flexible circuit board 300. The at least one third die bonding zone, the first die bonding zone and the at least one second die bonding zone were alternatively arranged. The at least one third semiconductor die 130 is bonded to the at least one third die bonding zone and electrically connected to the second circuit 340 through the third die bonding pads 332. Besides, the strip-shaped first flexible circuit board 250 is joined with the strip-shaped second flexible circuit board 300 through the first bonding pads 133 and the second bonding pads 134 formed on the second surface 250B and the third bonding pads 334 formed on the fourth surface 300B. The at least one third semiconductor die 130 and the at least one second semiconductor die 120 were alternatively stacked above the first semiconductor die 110 to make the first die bonding zone, the second die bonding zone and the third die bonding zone overlap with each other and form a folded flexible circuit board structure 1300 by folding the strip-shaped flexible circuit board 400 including the strip-shaped first flexible circuit board 250 and the strip-shaped second flexible circuit board 300. The folded flexible circuit board structure 1300 was vertically stacked on the package substrate 60 through the package substrate bonding pads 136 formed on the third surface 300A corresponding to the first die bonding zone and electrically connected therewith.

According to this present Embodiment, the package substrate 60 can be for example but not limited to a package substrate, a Ball Grid Array (BGA) package substrate including a ceramic BGA package substrate, a plastic BGA package substrate, a metal BGA package substrate and a tape BGA package substrate, a Chip Scale Package (CSP) substrate or a Flip Chip (FC) package substrate.

According to this present Embodiment, one first semiconductor die 110 was bonded to the first die bonding zone of the strip-shaped first flexible circuit board 250. However, more than one first semiconductor dies 110 can be alternatively bonded to the first die bonding zones of the strip-shaped first flexible circuit board 250 if necessary.

As shown in FIG. 1A, the first bonding pads 133 and the second bonding pads 134 of this present Embodiment were respectively electrically connected to the second circuit 340 through the fourth conductive holes 144 and the fifth conductive holes 145 formed in the second flexible substrate 320, and the third bonding pads 334 were electrically connected to the first circuit 245 through the sixth conductive holes 146 formed in the first flexible substrate 225.

As shown in FIGS. 1A~1B, the folded flexible circuit board structure 1300 as shown in FIG. 1B was obtained by folding the strip-shaped flexible circuit board 400 shown in FIG. 1A to make the second semiconductor die 120 and the third semiconductor dies 130 be vertically and alternatively stacked above the first semiconductor die 110 and make the first die bonding zone overlap with the second die bonding zone and the third die bonding zone. The obtained folded flexible circuit board structure 1300 was vertically stacked on the package substrate 60 and electrically connected therewith by the package substrate bonding pads 136, and then placed into a jig for subsequent package treatment to generate a 3D package configuration 1800 as shown in FIG. 1B.

The first semiconductor die 110, the second semiconductor die 120 and the third semiconductor die 130 of the 3D package configuration 1800 can respectively be for example but not limited to a CPU die, a GPU die, a DSP die, a MPU die, a MCU die, a DRAM die, a SRAM die, a Standard Logic IC die, an ASIC die for a special application, a sensing die with a specific sensing function, or a driving IC die.

The first die bonding pads 131, the second die bonding pads 132, the third die bonding pads 332, the first bonding pads 133, the second bonding pads 134, the third bonding pads 334 and the package substrate bonding pads 136 of the 3D package configuration 1800 are for example but not limited to solder balls or metallic bumps formed by a material selected from one of the group consisting of tin, tin alloys including tin/copper alloy, tin/ITO alloy, tin/silver alloy, tin/bismuth alloy and tin/lead alloy, and conductive polymers.

The material for the strip-shaped first flexible insulating substrate 225 and the strip-shaped second flexible insulating substrate 320 is selected from for example but not limited to one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

The material for the first circuit 245 and the second circuit 340 is selected from for example but not limited to one of the group consisting of copper, copper alloy, tinned copper, tin alloy, aluminum, aluminum alloys, gold and silver, or combinations thereof.

The above-mentioned 3D package configuration 1800, wherein the first circuit 245 of the strip-shaped first flexible circuit board 250 and the second circuit 340 of the strip-shaped second flexible circuit board 300 can be a single-layered circuit or a multiple-layered circuit, and the strip-shaped first insulating layer 265 overlaying the first circuit 245 and the strip-shaped second insulating layer 360 overlaying the second circuit 340 can also be a single-layered insulating layer or a multiple-layered insulating layer.

According to another Embodiment of this invention, additional adhesive layers can be coated on the first surface 250A and the second surface 250B of the strip-shaped first flexible circuit board 250, and/or the third surface 300A and the fourth surface 300B of the strip-shaped second flexible circuit board 300 to fasten the folded flexible circuit board structure 1300 vertically stacked on the package substrate 60.

As described in the above Embodiments, a novel 3D package configuration can be obtained by stacking a folded flexible circuit board structure on a package substrate and electrically connected therewith based on the foldable characteristics of the flexible circuit board, and the high temperature resistance of the flexible circuit board which is suitable for insulating layer process, metal layer process, photolithography process, etching and development process, to make conventional semiconductor dies such as CPU dies, GPU dies, DRAM dies, SRAM dies, tel-communication dies, standard logic IC dies, ASIC dies, various sensing IC dies, various driving IC and other semiconductor dies with various functions be bonded on one die and/or two side of a flexible circuit board and electrically connected therewith in advance.

Although particular Embodiments have been shown and described, it should be understood that the above discussion is not intended to limit the present invention to these Embodiments. Persons skilled in the art will understand that various changes and modifications may be made without departing from the scope of the present invention as literally and equivalently covered by the following claims.

What is claimed is:

1. A 3D package configuration, comprising:
   a package substrate; and
   a folded flexible circuit board structure vertically stacked on the package substrate and electrically connected therewith, comprising:
   a folded flexible circuit board formed by folding a strip-shaped flexible circuit board including a strip-shaped first flexible circuit board joined with a strip-shaped second flexible circuit board, wherein the strip-shaped first flexible circuit board comprises a first surface with a first die bonding zone and at least one second die bonding zone formed thereon and a second surface opposite to each other, and the strip-shaped second flexible circuit board comprises a third surface with at least one third die bonding zone formed thereon and a fourth surface opposite to each other, and a plurality of package substrate bonding pads corresponding to the first die bonding zone and electrically connected therewith are formed on the third surface of the second flexible circuit board;
   at least one first semiconductor die bonded to the first die bonding zone and electrically connected to the first flexible circuit board;
   at least one second semiconductor die bonded to the at least one second die bonding zone and electrically connected to the first flexible circuit board; and
   at least one third semiconductor die bonded to the at least one third die bonding zone and electrically connected to the second flexible circuit board;
   wherein, the at least one third semiconductor die and the at least one second semiconductor die are alternatively vertically stacked above the at least one first semiconductor die, and the folded flexible circuit board structure is electrically connected with the package substrate through the package substrate bonding pads.

2. The 3D package configuration as claimed in claim 1, comprising a plurality of second semiconductor dies spaced with each other, and a plurality of second die bonding zones formed on the strip-shaped first surface of the first flexible circuit board, wherein each of the second semiconductor dies is bonded to each of the second die bonding zone and electrically connected to the strip-shaped first flexible circuit board through a second bonding pad in each of the second die bonding zone.

3. The 3D package configuration as claimed in claim 1, comprising a plurality of third semiconductor dies spaced with each other, and a plurality of third die bonding zones formed on the third surface of the strip-shaped second flexible circuit board, wherein each of the third semiconductor dies is bonded to one of the third die bonding zones and electrically connected to the strip-shaped second flexible circuit board through a third bonding pad in each of the third bonding zones.

4. The 3D package configuration as claimed in claim 1, wherein the strip-shaped first flexible circuit board comprises a plurality of first bonding pads and a plurality of second bonding pads respectively formed on the second surface corresponding to the first die bonding zone and the at least one second die bonding zone, and the strip-shaped second flexible circuit board comprises a plurality of third bonding pads formed on the fourth surface corresponding to the at least one third die bonding zone, and the strip-shaped first flexible circuit is joined with the strip-shaped second flexible circuit board by the first bonding pads and the second pads formed on the second surface of the strip-shaped first flexible circuit and the third bonding pads formed on the fourth surface of the strip-shaped second flexible circuit board.

5. The 3D package configuration as claimed in claim 1, wherein the strip-shaped first flexible circuit board comprises:
   a strip-shaped first flexible insulating substrate;
   a first circuit formed on a surface of the strip-shaped first flexible insulating substrate; and
   a strip-shaped first insulating layer overlaying the first circuit;
   wherein, the first die bonding zone comprises a plurality of first bonding pads electrically connected to the first circuit to make the at least one first semiconductor die electrically connected to the first circuit through the first bonding pads, and the at least one second die bonding zone comprises a plurality of second die bonding pads electrically connected to the first circuit to make the at least one second semiconductor die electrically connected to the first circuit through the second die bonding pads.

6. The 3D package configuration as claimed in claim 5, wherein the material of the strip-shaped first flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

7. The 3D package configuration as claimed in claim 5, wherein the material of the first circuit is selected from one of the group consisting of copper, copper alloy, tinned copper, tin alloy, aluminum, aluminum alloys, gold and silver, or combinations thereof.

8. The 3D package configuration as claimed in claim 1, wherein the strip-shaped second flexible circuit board comprises:
   a strip-shaped second flexible insulating substrate;
   a second circuit formed on a surface of the strip-shaped second flexible insulating substrate; and
   a strip-shaped second insulating layer overlaying the second circuit;
   wherein, the at least one third die bonding zone is arranged to interlace with the first die bonding zone and the least one second die bonding zone, and the at least one third die bonding zone comprises a plurality of third bonding pads electrically connected to the second circuit to make the at least one third semiconductor die electrically connected to the second circuit through the third bonding pads.

9. The 3D package configuration as claimed in claim 8, wherein the material of the strip-shaped second flexible insulating substrate is selected from one of the group consisting of Polyester resin, Polyimide (PI), Modified Polyimide (MPI), Covalent Organic Framework (COF), Liquid Photo-Imageable (LPI), Liquid Crystal Polymer (LCP), Polytetrafluoroethylene (PTFE) and flexible epoxy bonded fiber-glass board, or combinations thereof.

10. The 3D package configuration as claimed in claim 8, wherein the material of the second circuit is selected from one of the group consisting of copper, copper alloy, tinned copper, tin alloy, aluminum, aluminum alloys, gold and silver, or combinations thereof.

* * * * *